(12) United States Patent
Matsumoto et al.

(10) Patent No.: US 6,486,513 B1
(45) Date of Patent: Nov. 26, 2002

(54) SEMICONDUCTOR DEVICE

(75) Inventors: Takuji Matsumoto, Tokyo (JP); Shigenobu Maeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/464,436

(22) Filed: Dec. 16, 1999

(30) Foreign Application Priority Data

Jul. 23, 1999  (JP) ............................................. 11-209256

(51) Int. Cl.$^7$ ............................................... H01L 27/01
(52) U.S. Cl. .................... 257/347; 257/348; 257/349
(58) Field of Search ................................. 257/347–354

(56) References Cited

U.S. PATENT DOCUMENTS

| | | | | |
|---|---|---|---|---|
| 5,698,869 A | * | 12/1997 | Yoshimi et al. .............. | 257/192 |
| 5,770,881 A | * | 6/1998 | Pelella et al. ................ | 257/347 |
| 5,895,766 A | * | 4/1999 | Manning ...................... | 438/305 |
| 6,121,100 A | * | 9/2000 | Andideh et al. ............. | 438/305 |
| 6,235,568 B1 | * | 5/2001 | Murthy et al. ............... | 438/231 |

FOREIGN PATENT DOCUMENTS

| | | | | |
|---|---|---|---|---|
| JP | 1-120069 | * | 5/1989 | ............ H01L/21/88 |
| JP | 2-54967 | * | 2/1990 | ......... H01L/29/784 |
| JP | 4-34979 | * | 2/1992 | ......... H01L/29/784 |
| JP | 5-021762 | | 1/1993 | |
| JP | 5-067785 | | 3/1993 | |
| JP | 6-268215 | | 9/1994 | |
| JP | 8-130315 | | 5/1996 | |
| JP | 10-98200 | * | 4/1998 | ................. 257/347 |
| JP | 11-87719 | | 3/1999 | |
| JP | 1999-029240 | | 4/1999 | |

OTHER PUBLICATIONS

Terukazu Ohno, et al., "Suppression of the Parasitic Bipolar Effect in Ultra–Thin–Film nMOSFETs/SIMOX By Ar Ion Implantation Into Source/Drain Regions", IEDM, 1995, pp. 627–630.

Makoto Yoshimi, et al., "Suppression of the Floating–Body Effect in SOI MOSFET's By the Bandgap Engineering Method Using a $Si_{1-x}Ge_x$ Source Structure", IEEE Transactions on Electron Devices, vol. 44, No. 3, Mar. 1997, pp. 423–429.

Yo–Hwan Koh, et al., "Body–Contacted SOI MOSFET Structure and Its Application To DRAM", IEEE Transactions on Electron Devices, vol. 45, No. 5, May 1998, pp. 1063–1070.

* cited by examiner

Primary Examiner—Tom Thomas
Assistant Examiner—Ori Nadav
(74) Attorney, Agent, or Firm—Oblon, Spivak, McClelland, Maier & Neustadt, P.C.

(57) ABSTRACT

An SOI layer is provided in a buried oxide film and a source and a drain are provided on the upper surface of the SOI layer so that they are kept from contact with the buried oxide film. A depletion layer formed by the source, the drain, and the SOI layer extends to reach the buried oxide film, so parasitic capacitance is reduced. This structure achieves an SOIMOS transistor capable of reducing junction capacitance at low drain voltage.

6 Claims, 14 Drawing Sheets

SEMICONDUCTOR DEVICE

BACKGROUND OF THE INVENTION

1. Field of the Invention

The present invention relates to a silicon-on-insulator metal-oxide semiconductor transistor (hereinafter referred to as an SOIMOS transistor), more particularly relates to a technique for suppressing a floating-body effect in the transistor.

2. Description of the Background Art

Great attention is now focused on SOIMOS transistors as high-speed, low-power devices and their application to LSI for portable equipment for example is expected.

A conventional SOIMOS transistor, however, has its body in a floating state, thus producing a parasitic bipolar effect that one type of carriers which are produced by impact ionization in the vicinity of the drain (e.g., holes for n-type SOIMOS transistors and electrons for p-type SOIMOS transistors) are accumulated in the vicinity of the source, whereby a parasitic bipolar transistor comprised of source, body, and drain enters into its active state. This produces a kink effect of reducing a threshold voltage of the SOIMOS transistor and thereby causing a sudden local change in drain current in the vicinity of certain drain voltage (voltage applied between source and drain) and causes a problem of reducing a drain breakdown voltage. If impurity concentration in the channel region is increased to suppress reduction in the threshold voltage of the SOIMOS transistor due to the parasitic bipolar effect, current driving capability and speed performance of the transistor are degraded.

To suppress the parasitic bipolar effect, various techniques for preventing the accumulation of carriers in the vicinity of the source of an SOIMOS transistor have been proposed. In the following description, an n-type SOIMOS transistor is taken as an example, but the same applies to a p-type SOIMOS transistor.

FIG. 22 is a cross-sectional view showing the structure of a conventional SOIMOS transistor. On a buried oxide film 2 formed on a semiconductor substrate 1, an SOI layer 4, which is to be a body along with a channel region, is formed and a source 51 and a drain 52 are formed through the SOI layer 4. The source 51 and the drain 52 have for example LDD (Lightly Doped Drain) structures. The SOI layer 4 sandwitched between the source 51 and the drain 52 is opposed to a gate electrode 7 with a gate oxide film 6 including sidewalls in between. On the outer side of the source 51 and the drain 52, a trench isolation oxide film 31 is provided through the SOI layer 4.

For such an SOIMOS transistor, a first conventional technique for preventing the accumulation of holes in the vicinity of the source 51 is to implant argon ions in the vicinity of the boundary between the source 51 and the buried oxide film 2 to thereby produce lifetime killers. This technique is introduced for example by T. Ohno et. al. in the article entitled "Suppression of the Parasitic Bipolar Effect in Ultra-Thin-Film nMOSFETs/SIMOX by Ar Ion Implantation into Source/Drain Regions," Tech. Dig. IEDM, 1995, pp.627–630.

FIG. 23 is a cross-sectional view showing the case where a salicide (self-aligned silicide) structure is applied to the structure of FIG. 22. In contrast to the structure of FIG. 22, silicide layers 58, 59, 79 are formed on the source 51, the drain 52, and the gate electrode 7, respectively.

FIG. 24 is a cross-sectional view showing another structure of a conventional SOIMOS transistor. In contrast to the structure of FIG. 22, the source 51 and the drain 52 include germanium-implanted regions 81 and 82, respectively, which are formed in the surface (upper surface) of the SOI layer 4 on the opposite side of the buried oxide film 2. The source 51 and the drain 52 are for example formed of silicon and thus the components of the regions 81 and 82 are Si—Ge. in a second conventional technique presenting such a structure, distortion of the band structure occurs between source and body. This technique is introduced for example by M. Yoshimi et. al. in the article entitled "Suppression of the Floating-Body Effect in SOIMOSFET's by the Bandgap Engineering Method Using a $Si_{1-x}Ge_x$ Source Structure," IEEE Trans. Electron Devices, vol. 44, 1997, pp. 423–429.

In either of the first and second conventional techniques, however, the source 51 and the drain 52 reach the buried oxide film 2 through the SOI layer 4, so a problem of the impracticability of suppressing a "diffraction electric field" still remains. Similar structures are also disclosed in other references such as Japanese Patent Laid-open No. P08-130315A.

FIG. 25 is a cross-sectional view illustrating a "drain electric field through the buried oxide". When a predetermined voltage is applied to the gate electrode 7 and a higher potential than that on the source 51 is imposed on the drain 52, a depletion layer 91 is formed and an electric field 101 is generated from the drain 52 through the buried oxide film 2 to the channel region 4. Hereinafter, this is called the "diffraction electric field".

With the "diffraction electric field," a drain-induced barrier lowering (DIBL) effect becomes noticeable. This DIBL effect is a kind of short channel effect that a source-side potential barrier varying with drain voltage reduces the threshold value of a transistor. The occurrence of the "diffraction electric field" should preferably be prevented especially in an element with the buried oxide film 2, such as an SOIMOS transistor.

There is also proposed a structure in which neither the source 51 nor the drain 52 reach the buried oxide film 2 through the SOI layer 4. FIG. 26 is a cross-sectional view showing still another structure of a conventional SOIMOS transistor. In contrast to the structure of FIG. 22, the source 51 and the drain 52 are formed within the SOI layer 4 so that their bottoms are kept from contact with the buried oxide film 2. This allows drawing of holes from the opposite side of the gate electrode 7 with respect to the source 51, through the remaining SOI layer 4 between the source 51 and the buried oxide film 2. Such a third conventional technique is introduced for example by Y.-H.Koh et al. in the article entitled "Body-Contacted SOI MOSFET Structure and Its Application to DRAM," IEEE Trans. Electron Devices, vol. 45, 1998, pp. 1063–1070, and also in Japanese Patent Laid-open No. P05-67785A.

This structure, however, requires a body terminal for drawing holes and the formation of a body terminal may cause an area penalty. Further, effects achieved by the method for drawing holes through a body terminal vary according to the location of a body contact region; therefore, a problem of pattern dependence arises.

In FIG. 26, the ends of a depletion layer 92 are within the SOI layer 4, failing to reach the buried oxide film 2 since drain voltage is small. If the drain voltage is more than a predetermined value, the ends of the depletion layer 92 would reach the buried oxide film 2, causing a voltage drop across the depletion layer along with reduction in junction capacitance. This may lower voltage across the buried oxide film 2, thereby reducing the intensity of the "diffraction electric field". Junction capacitance in the source also needs to be reduced because it is to be the cause for reduction in the operating speed when the source potential is lowered.

SUMMARY OF THE INVENTION

A first aspect of the present invention is directed to a semiconductor device comprising: an insulating layer; a semiconductor layer of a first conductivity type provided on the insulating layer; first and second impurity layers of a second conductivity type opposite to the first conductivity type, which are provided apart from each other in an upper surface of the semiconductor layer so as to be kept from contact with the insulating layer; and an electrode opposed to a portion of the upper surface of the semiconductor layer which is sandwiched between the first and second impurity layers, with an insulation film in between, wherein a depletion layer formed by the first impurity layer and the semiconductor layer extends to the insulating layer without application of voltage from outside.

According to a second aspect of the present invention, in the semiconductor device of the first aspect, the first impurity layer is formed by introducing impurities of the second conductivity type into the semiconductor layer; and the following equation holds:

$$\sqrt{(2\varepsilon s/q) \cdot ((Ne+Nb)/Ne \cdot Nb) \cdot (kT/q)\ln(Ne \cdot Nb/ni^2)} \geq t$$

where t is the thickness of the semiconductor layer between the insulating layer and the first impurity layer; Nb is the impurity concentration of the semiconductor layer; Ne is the impurity concentration of the first impurity layer; q is the elementary charge; k is Boltzman's constant; T is the absolute temperature; and ni, $\in$s are the intrinsic carrier concentration and the dielectric constant of the semiconductor layer and the first impurity layer, respectively.

According to a third aspect of the present invention, the semiconductor device of the first aspect further comprises: a lifetime killer formed in the semiconductor layer between the first impurity layer and the insulating layer.

A fourth aspect of the present invention is directed to a semiconductor device comprising: an insulating layer; a semiconductor layer of a first conductivity type provided on the insulating layer; first and second impurity layers of a second conductivity type opposed to the first conductivity type, which are provided apart from each other in an upper surface of the semiconductor layer so as to be kept from contact with the insulating layer; an electrode opposed to a portion of the upper surface of the semiconductor layer which is sandwitched between the first and second impurity layers, with an insulation film in between; and a lifetime killer formed in the semiconductor layer between the first impurity layer and the insulating layer, the lifetime killer not existing in the semiconductor layer between the first and second impurity layers.

According to a fifth aspect of the present invention, the semiconductor devices of the third and fourth aspects further comprise: a metal compound layer formed on a surface of the first impurity layer.

According to a sixth aspect of the present invention, in the semiconductor device of the fifth aspect, a distance from a surface of the metal compound layer to the insulating layer is smaller than a thickness of the semiconductor layer between the insulation film and the insulating layer.

According to a seventh aspect of the present invention, in the semiconductor devices of the fifth and sixth aspects, the first impurity layer is made with silicon; the metal compound layer is a compound of cobalt with silicon; and a thickness of the first impurity layer ranges from 15 to 40 nm.

According to an eighth aspect of the present invention, in the semiconductor devices of the fifth and sixth aspects, the first impurity layer is made with silicon; the metal compound layer is a compound of titanium with silicon; and a thickness of the first impurity layer ranges from 50 to 100 nm.

According to a ninth aspect of the present invention, the semiconductor devices of the first and second aspects further comprises: a third impurity layer provided apart from the semiconductor layer in an upper surface of the first impurity layer, the third impurity layer causing distortion of a band structure of the first impurity layer which is sandwiched between the third impurity layer and the semiconductor layer.

A tenth aspect of the present invention is directed to a semiconductor device comprising: an insulating layer; a semiconductor device of a first conductivity type provided on the insulating layer; first and second impurity layers of a second conductivity type opposed to the first conductivity type, which are provided apart from each other in an upper surface of the semiconductor layer so as to be kept from contact with the insulating layer; an electrode opposed to a portion of the upper surface of the semiconductor layer which is sandwiched between the first and second impurity layers, with an insulation layer in between; and a third impurity layer provided apart from the semiconductor layer in an upper surface of the first impurity layer, the third impurity layer causing distortion of a band structure of the first impurity layer which is sandwiched between the third impurity layer and the semiconductor layer.

An eleventh aspect of the present invention is directed to a semiconductor device comprising: an insulating layer; a semiconductor layer of a first conductivity type provided on the insulating layer; first and second impurity layers of a second conductivity type opposed to the first conductivity type, which are provided apart from each other in an upper surface of the semiconductor layer; an electrode opposed to a portion of the upper surface of the semiconductor layer which is sandwitched between the first and second impurity layers, with an insulation film in between; and an insulation film containing nitrogen, which is formed through the semiconductor layer to be adjacent to the first impurity layer on the opposite side of the second impurity layer.

The semiconductor device of the first aspect can suppress diffraction electric field through the insulating layer while reducing junction capacitance between the first impurity layer and the semiconductor layer. The device can thus reduce parasitic capacitance and suppress a drain-induced barrier lowering effect.

In the semiconductor device of the second aspect, the depletion layer formed by the first impurity layer and the semiconductor layer extends to the insulating layer without the application of voltage from outside.

Unlike the structure in which the first impurity layer is in contact with the insulating layer, the semiconductor device of the third aspect includes lifetime killers over a wide range, thereby suppressing unnecessary carrier remaining and the parasitic bipolar effect.

The semiconductor device of the fourth aspect can suppress accumulation of carriers (holes for an NMOS) in the vicinity of the source, thereby suppressing the parasitic bipolar effect without reducing punch-through resistance.

In the semiconductor device of the fifth aspect, the presence of a metal compound layer allows lifetime killers to be formed in the semiconductor layer between the first impurity layer and the insulating layer.

In the semiconductor device of the sixth aspect, it is easy to bring the depletion layer in contact with the isolating layer while reducing the thickness of the first impurity layer.

The semiconductor devices of the seventh and eighth aspects can enhance the effect of the semiconductor device of the sixth aspect.

Unlike the structure in which the first impurity layer is in contact with the insulating layer, the semiconductor devices of the ninth and tenth aspects include distortion of the band structure over a wide range. This suppresses accumulation of carriers (holes for an NMOS) in the vicinity of the source and the parasitic bipolar effect.

In the semiconductor device of the eleventh aspect, lifetime killers such as crystal defects, crystal distortion, point defects, and recombination centers are produced at the interfaces and its vicinity between the insulating layer and each of the semiconductor layer and the first impurity layer. This suppresses the parasitic bipolar effect.

In view of the still remaining problems in the conventional first through third techniques, an object of the present invention is to provide an SOIMOS transistor having small junction capacitance even with low drain voltage and capable of suppressing the floating-body effect.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
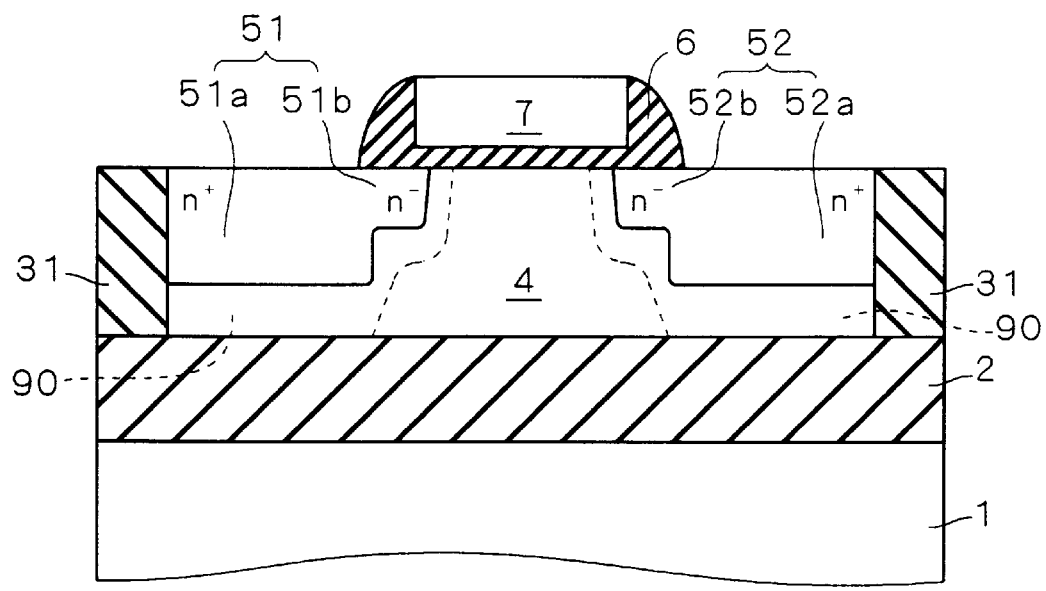
FIG. 1 is a cross-sectional view showing the structure of an SOIMOS transistor according to a first preferred embodiment of the present invention.

FIG. 1 is a cross-sectional view showing the structure of an SOIMOS transistor according to a first preferred embodiment of the present invention. On a buried oxide film 2 formed on a p-type semiconductor substrate 1 made for example of silicon, an SOI layer 4, which is to be a body along with a channel region, is formed and an n-type source 51 and an n-type drain 52 are formed in the surface of the SOI layer 4 on the opposite side of the buried oxide film 2. The bottoms of the respective source and drain 51, 52 are kept from contact with the buried oxide film 2. For example, the source 51 and the drain 52 have LDD (Lightly-doped Drain) structures; more specifically, the source 51 includes a region 51a with high impurity concentration and a region 51b with low impurity concentration, while the drain 52 includes a region 52a with high impurity concentration and a region 52b with low impurity concentration.

The SOI layer 4 sandwitched between the source 51 and the drain 52 is opposed to a gate electrode 7 with a gate oxide film 6 including sidewalls in between. On the outer side of the source 51 and the drain 52 with respect to the gate electrode 7, a trench isolation oxide film 31 is provided through the SOI layer 4.

Figure 26:
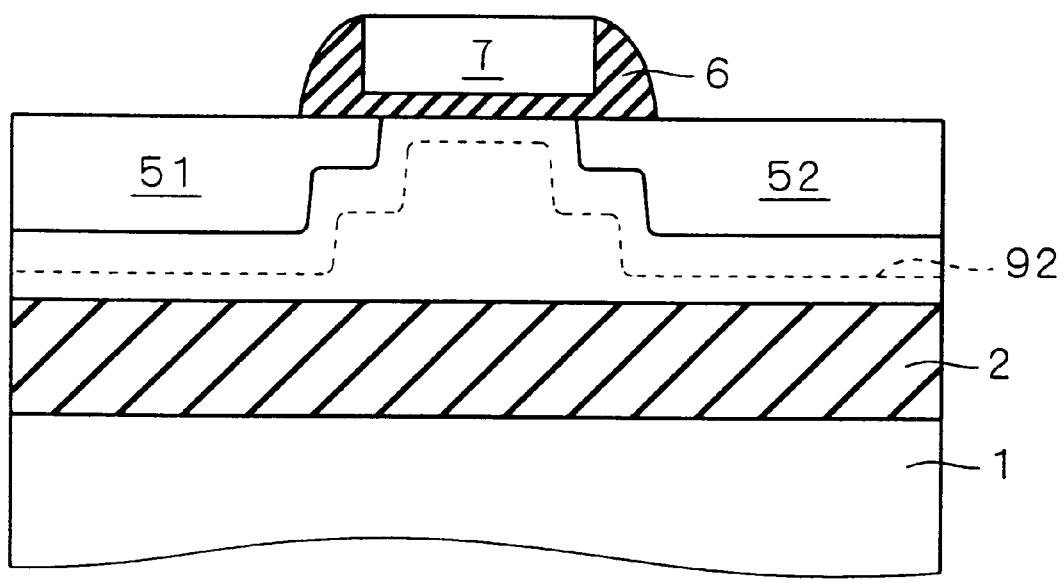
FIG. 26 is a cross-sectional view showing still another structure of a conventional SOIMOS transistor.

The first preferred embodiment differs from the third conventional technique of FIG. 26 in that the ends of a depletion layer 90 reach the buried oxide film 2 even without the application of drain voltage. This reduces junction capacitance with low drain voltage, thereby suppressing the diffraction electric field. Accordingly, parasitic capacitance is reduced and the DIBL effect is suppressed.

In general, delay time T and electric power consumption P of a MOS circuit can be expressed by:

$$\tau = C \cdot V/I \text{ and } P = f \cdot C \cdot V^2$$

where C is the capacitance across the circuit; I is the current flowing through the circuit; V is the power source voltage; and $f$ is the operating frequency. These equations state that reducing the parasitic capacitance contributes to an increase in circuit speed and a reduction in power consumption. The SOIMOS transistor according to the first preferred embodiment can thus achieve high-speed, low-power operation.

By suppressing the DIBL effect, the problem of reduction in the threshold value of a transistor can also be resolved.

We will now describe the conditions required to bring the ends of the depletion layer 90 in contact with the buried oxide film 2 without the application of drain voltage.

Figure 2:
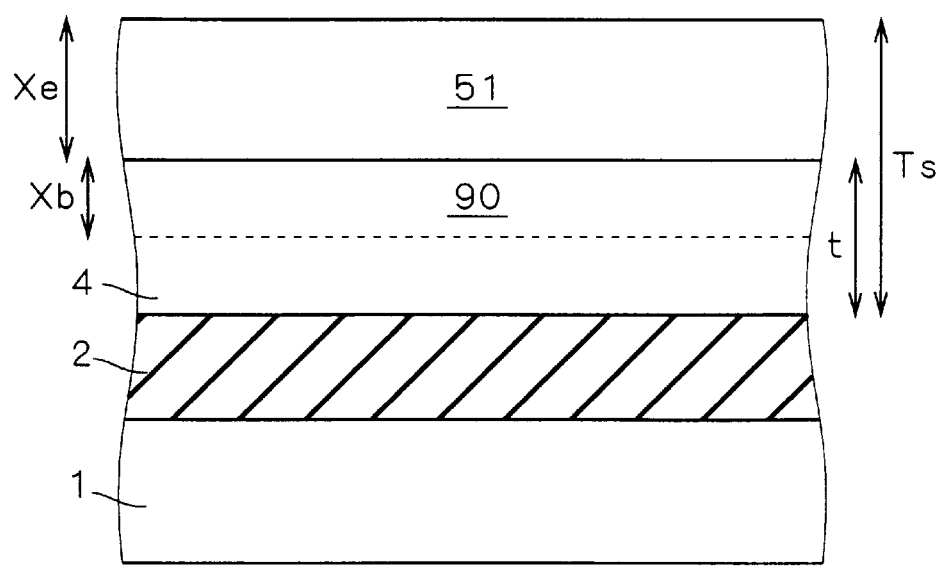
FIG. 2 is a cross-sectional view to explain the first preferred embodiment of the present invention.

FIG. 2 is a cross-sectional view of the source 51 and the underlying structure to explain such conditions. The total thickness of the SOI layer 4, i.e., the thickness of a region where the source 51 is not formed, is defined as Ts, the thickness of the source 51 as Xe (<Ts), and the thickness of the depletion layer 90 as Xb. The thickness Xb can be expressed by the following equations (1), (2):

$$Xb = \sqrt{\frac{2\varepsilon s}{q}\left(\frac{Ne+Nb}{Ne \cdot Nb}\right) \cdot Vbi} \qquad (1)$$

$$Vbi = \frac{kT}{q}\ln\frac{Ne \cdot Nb}{ni^2} \quad (2)$$

where ∈s is the dielectric constant of the SOI layer 4; q is the elementary charge ($1.6 \times 10^{-19}$ coulomb); Ne and Nb are the impurity concentrations of the source 51 and the SOI layer 4, respectively; T is the absolute temperature; ni is the intrinsic carrier concentration of a semiconductor device adopted to the SOI layer 4 and the source 51; K is Boltzman's constant; and Vbi is the diffusion potential. Even without the application of drain voltage, the following equation (3) must hold to bring the ends of the depletion layer 90 in contact with the buried oxide film 2:

$$Xb \geq t = Ts - Xe \quad (3)$$

where t is the thickness of the SOI layer 4 between the buried oxide film 2 and the source 51. When the SOI layer 4 and the source 51 are formed of silicon and their impurity concentrations are $10^{18}$ cm$^{-3}$ and $10^{20}$ cm$^{-3}$, respectively, for example, since the specific dielectric constant of silicon, the dielectric constant of vacuum, and the intrinsic carrier concentration ni are 11.9, $8.85 \times 10^{-14}$ F/cm, and $1.45 \times 10^{10}$ cm$^{-3}$, respectively, the thickness Xb of the depletion layer 90 can be estimated at approximately 37 nm in room temperature (T=about 300 K). For a 100 -nm thick SOI layer 4, for example, the thickness Xe of the source 51 must be not less than 63 nm and under 100 nm.

Figure 3:
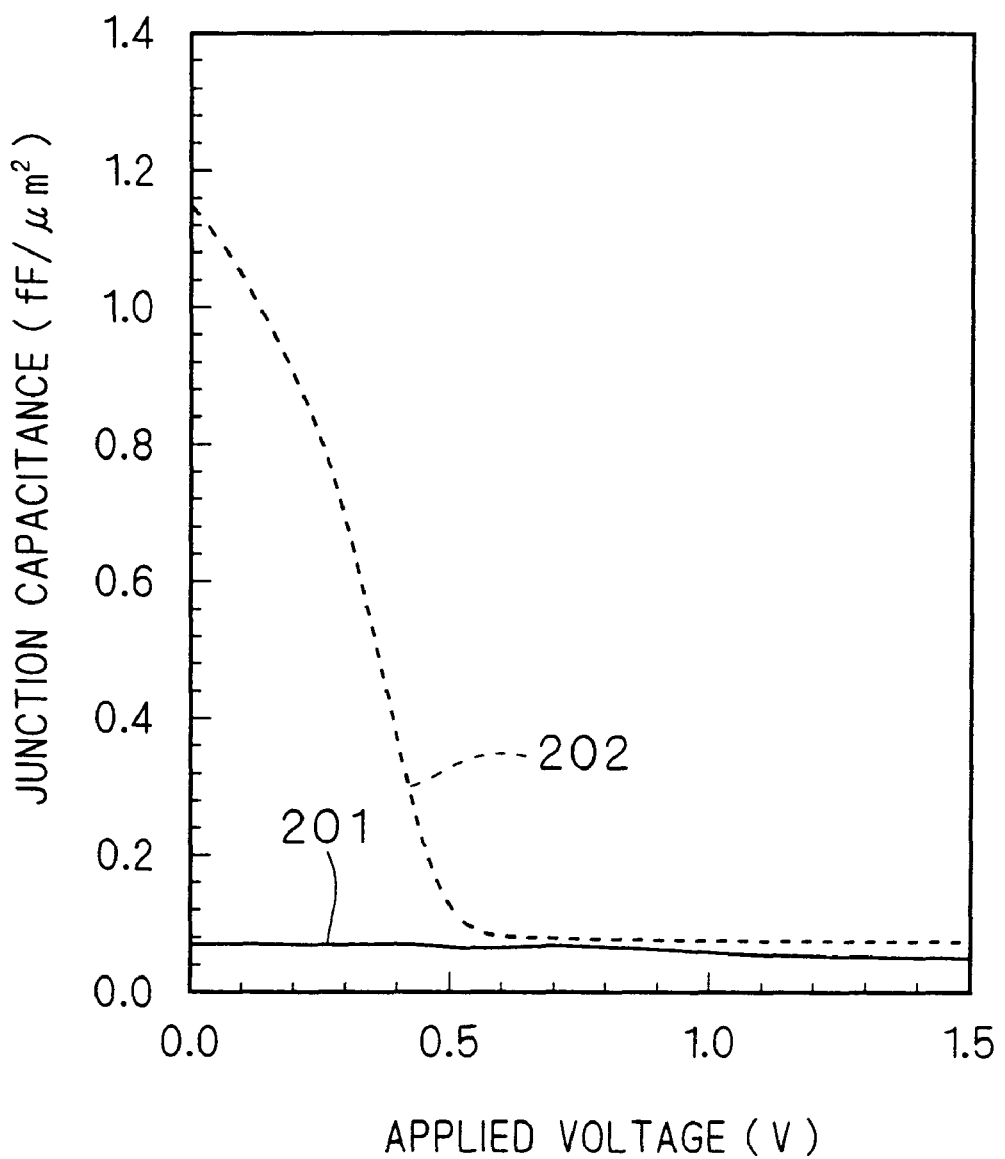
FIG. 3 is a graph showing the effect of the first preferred embodiment of the present invention.

FIG. 3 is a graph showing the effect of the SOIMOS transistor shown in FIG. 1. The curves 201 and 202 indicate the effects of the respective SOIMOS transistors of the first preferred embodiment and the third conventional technique. In the graph, the horizontal axis indicates the voltage applied to the drain 52 with the SOI layer 4 and the source 51 connected in common, and the vertical axis indicates the junction capacitance. It is apparent from the comparison between the curves 201 an 202 that the first preferred embodiment is superior to the third conventional technique at the applied voltage of 0.5 V or less. In view of recent trend to reduce the source voltage, such reduction in the junction capacitance at low voltage is advantageous.

Figure 4:
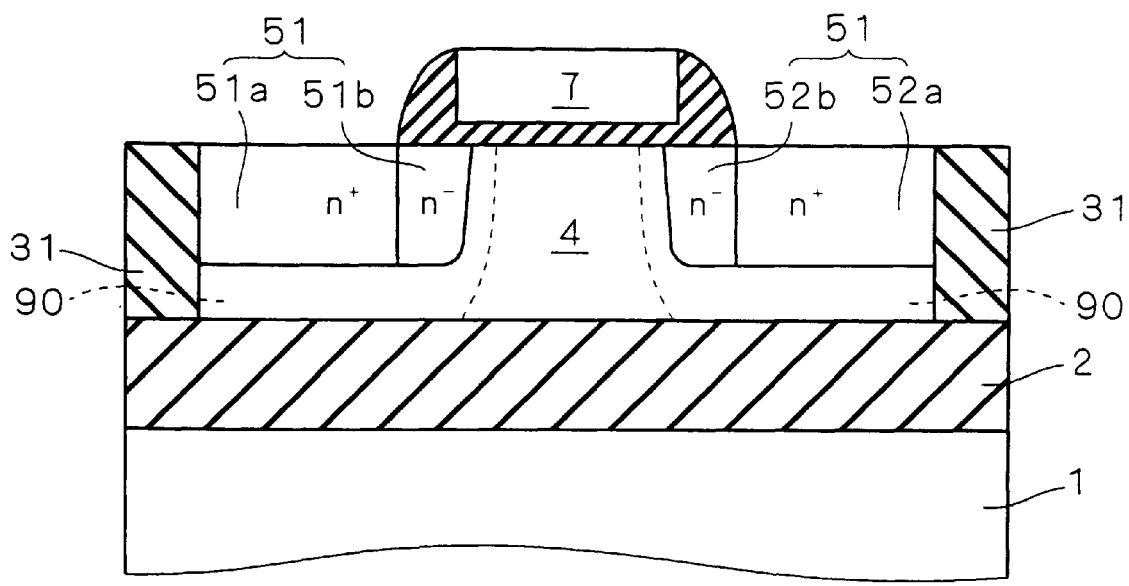
FIG. 4 is a cross-sectional view showing a variant of the first preferred embodiment of the present invention.

FIG. 4 is a cross-sectional view showing a variant of the first preferred embodiment, wherein the regions 51b and 52b with low impurity concentration grow to the same thickness as the regions 51a and 52a with high impurity concentration and the depletion layer 90 extends to reach the buried oxide film 2 even immediately below the regions 51b and 52b with low impurity concentration. As compared to the structure of FIG. 1, this structure increases a portion where the depletion layer 90 is in contact with the buried oxide film 2, thereby further reducing the junction capacitance.

Second Preferred Embodiment

Figure 5:
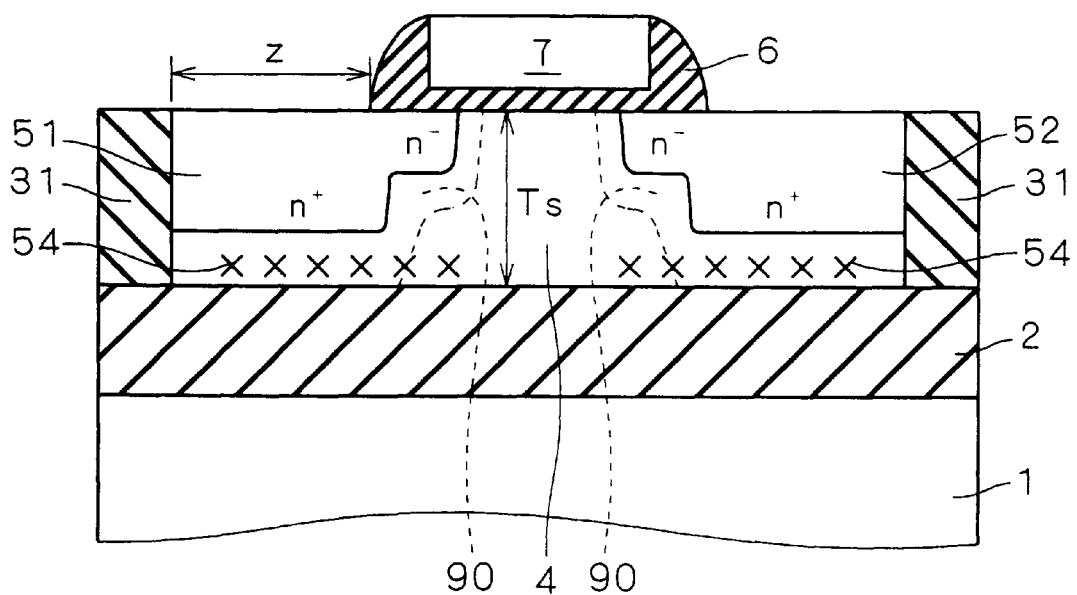
FIG. 5 is a cross-sectional view showing the structure of an SOIMOS transistor according to a second preferred embodiment of the present invention.

By introducing lifetime killers to the structure of the first preferred embodiment the effect of the first conventional technique can further be enhanced. FIG. 5 is a cross-sectional view showing the structure of an SOIMOS transistor according to a second preferred embodiment. This structure is characteristically different from the structure of FIG. 1 in that lifetime killers 54 are introduced into the SOI layer 4 between the buried oxide film 2 and the source and drain 51, 52. In the second preferred embodiment, the relations between the equations (1) to (3) should preferably be maintained but it is not an absolute necessity.

When the thickness Ts of the SOI layer 4 is 1,000 Å, for example, the source 51 and the drain 52 are formed by implanting arsenic ions into the SOI layer 4 at an energy of 20 keV or less so that they are kept from contact with the buried oxide film 2. After the formation of the source 51 and the drain 52, argon ions are implanted at an angle of 30 degrees or less at an energy in the range of 70 to 110 keV at a dose in the range of $1 \times 10^{13}$ to $5 \times 10^{14}$ cm$^{-2}$ to produce the lifetime killers 54. Here implant ions may be silicon, carbon, nitrogen, or fluorine instead of argon.

Figure 22:
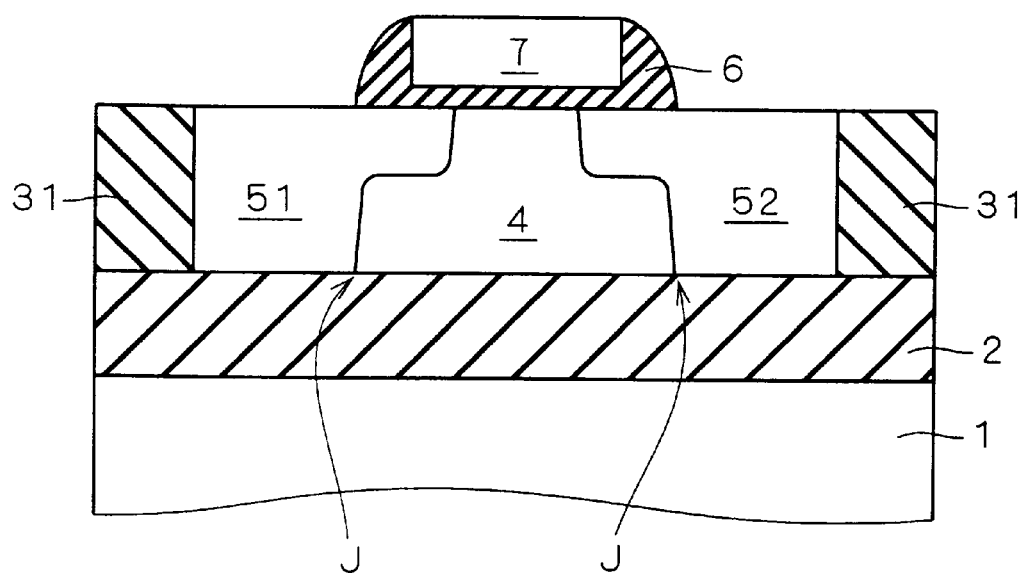
FIG. 22 is a cross-sectional view showing the structure of a conventional SOIMOS transistor.
Figure 23:
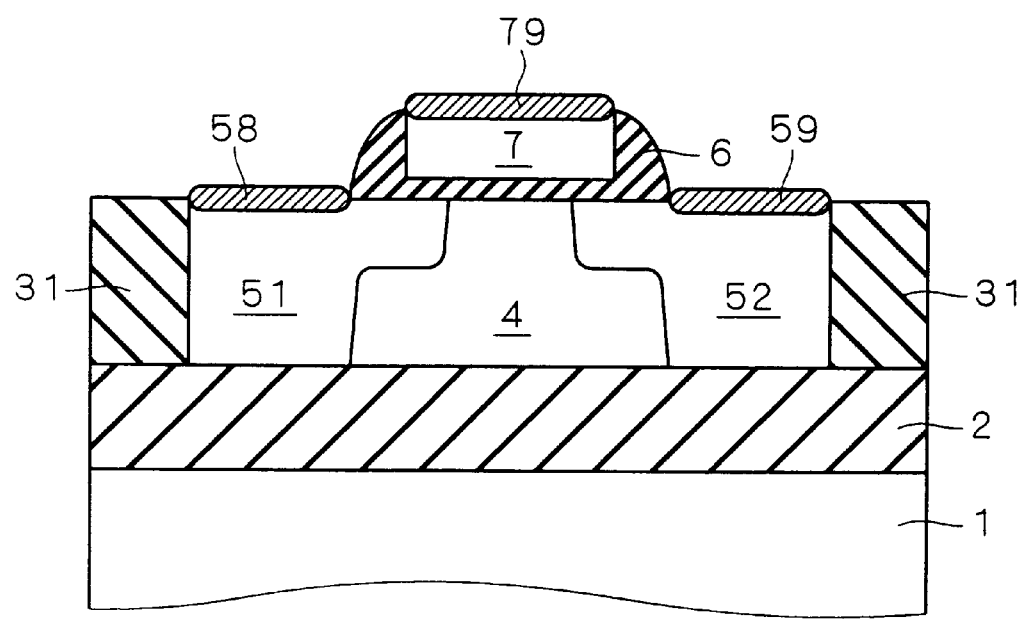
FIG. 23 is a cross-sectional view showing the case where a salicide structure is applied to the structure of FIG. 22.

The lifetime killers 54 produced by the argon implantation are specifically transformed into crystal defects, crystal distortion, point defects, or recombination centers. In order to reduce lifetime in holes and suppress accumulation of holes, the lifetime killers 54 are preferably provided over a wide range of region. However, if the source 51 and the drain 52 are in contact with the buried oxide film 2 as shown in the structure of FIG. 22, argon implantation produces lifetime killers only in the vicinity of positions where the source 51 and the drain 52 are in contact with the buried oxide film 2 and the SOI layer 4 (J in FIG. 22). Of course, enhancement of the effect of suppressing the parasitic bipolar effect is possible with increase in the dose of argon and widening of the implantation angle; but in that case, a portion of the SOI layer 4 near the gate electrode 7, i.e., the channel region, is influenced by crystal defects, crystal distortion, or point defects and thus current driving capability is degraded.

In the structure of FIG. 22, effectively functioning lifetime killers are distributed only within the thickness Ts of the SOI layer 4 even if argon has a wide distribution. Thus, the area in which lifetime killers contribute to reduction in the lifetime in holes is about w·Ts where w is the gate width. In the second preferred embodiment, that area is further increased by w·z where z is the length of the source 51 exposed in the direction of the gate length; therefore, the effect of suppressing the parasitic bipolar effect is enhanced. When Ts=100 nm, w=1 μm, and z=5 μm in the second preferred embodiment, for example, the area in which lifetime killers contribute to the reduction in the lifetime in holes is about 51 times wider than that in the structure of FIG. 22. This effect is achieved by the locations of the lifetime killers 54, so the equations (1) to (3) do not have to hold. Since the source 51 and the drain 52 are kept from contact with the buried oxide film 2, the diffraction electric field can also be suppressed.

In this fashion, the parasitic bipolar effect can be suppressed even if implantation conditions are such that the influences of crystal defects, crystal distortion, or point defects on the channel region due to argon are excluded. In other words, suppression of the parasitic bipolar effect is possible along with the prevention of degradation in current driving capability.

If the relations between the equations (1) to (3) are maintained, not only suppressing the parasitic capacitance to achieve high-speed performance and low power consumption as in the first preferred embodiment but also enhancing the effect of the first conventional technique to thereby suppress the kink effect and the floating-body effect such as reduction in drain break voltage become possible. Besides, the second preferred embodiment requires no body terminal for the suppression of the floating-body effect, so there is no area-penalty problem. While the method of drawing holes through a body terminal had a problem of pattern dependency because of the varying degrees of drawing effects according to the location of the body contact, the second preferred embodiment, requiring no body terminal, is free from such a problem.

As shown in FIG. 1, the depletion layer 90 extends from the source 51 and the drain 52 to the buried oxide film 2; in this case, some of the lifetime killers 54 are within the depletion layer 90 but some are not, for example, immediately below the regions 51b and 52b with low impurity concentration. In the variant of FIG. 4, on the other hand, practically all the lifetime killers 54 are within the depletion layer 90. The present invention also includes this variant.

Japanese Patent Laid-open No. P07-50417A for example discloses a technique for producing lifetime killers even immediately below the channel region in the structure where the source and the drain are kept from contact with an insulating layer which is to be an underlying layer of the SOI layer 4. However, the speed of impurity diffusion is generally increased in a region with lifetime killers, so producing lifetime killers immediately below the channel region is likely to cause impurities in the source and the drain to be diffused into the channel region, thus lowering punch-through resistance.

In other words, it is better not to produce lifetime killers immediately below the channel region as in the present invention, in order not to lower the punch-through resistance.

Third Preferred Embodiment

Figure 6:
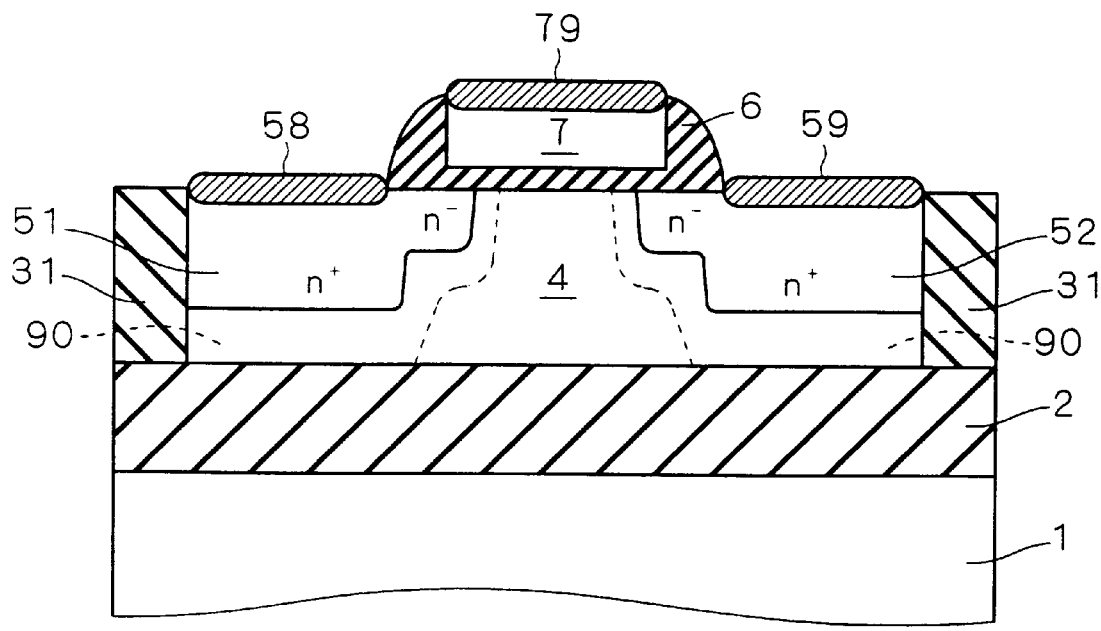
FIG. 6 is a cross-sectional view showing the structure of an SOIMOS transistor according to a third preferred embodiment of the present invention.

FIG. 6 is a cross-sectional view showing the structure of an SOIMOS transistor according to a third preferred embodiment of the present invention. This structure is characteristically different from that of FIG. 1 in that metal compound layers, e.g., silicide layers 58, 59, 79, are formed on the source 51, the drain 52, and the gate electrode 7, respectively. In the third preferred embodiment, the relations between the equations (1) to (3) should preferably be maintained but it is not an absolute necessity.

When the bottoms of the source 51 and the drain 52 are kept from contact with the buried oxide film 2 as in the first preferred embodiment, the formation of the silicide layers 58 and 79 produces lifetime killers as in the second preferred embodiment. That is, it is considered that crystal defects, crystal distortion, point defects, and recombination centers are produced by silicidation. Thus, the same effect as in the second preferred embodiment can be obtained. Areas where lifetime killers are formed may be the same as in the second preferred embodiment. Further as in the case of the second preferred embodiment, even if the equations (1) to (3) do not hold, effects derived from the silicide layers 58 and 79 can be obtained as long as the source 51 and the drain 52 are kept from contact with the buried oxide film 2.

A salicide structure is achieved for example by forming the silicide layers 58, 59, 79 of $CoSi_2$, $TiSi_2$, $WSi_2$, $TaSi_2$, $MoSi_2$, $PtSi_2$, $Pt_2Si$, $Pd_2Si$, PdSi, NiSi, or $NiSi_2$. It is of course needless to say that the effect of the third preferred embodiment can be achieved even with the structure that silicide is used only for the source and drain and not for the gate.

Figure 7:
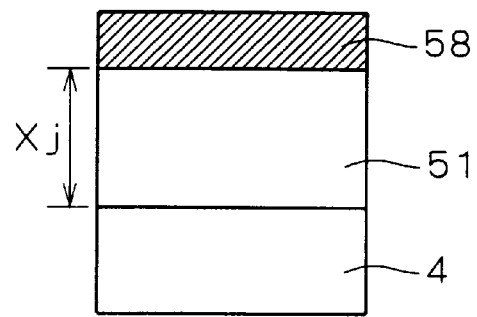
FIG. 7 is a cross-sectional view to explain the third preferred embodiment of the present invention.

In order for the silicide layer 58 to produce lifetime killers that act effectively against holes in the vicinity of the source 51, a source 51 of excessive thickness is undesirable. FIG. 7 is a cross-sectional view illustrating a desirable thickness Xj of the source 51. The thickness Xj is defined as the length between the bottom of the silicide layer 58 to the upper surface of the SOI layer 4. The silicide layer 58 is on the source 51 and the SOI layer 4 is under the source 51. For lifetime killers to effectively function, the thickness Xj of the source 51 should preferably be 100 nm or less depending on the material of the silicide layer.

Experimental results confirm that the desirable thickness Xj of the source 51 is in the range of 15 to 40 nm for a silicide layer 58 of $CoSi_2$ and in the range of 50 to 100 nm for a silicide layer 58 of $TiSi_2$.

Figure 8:
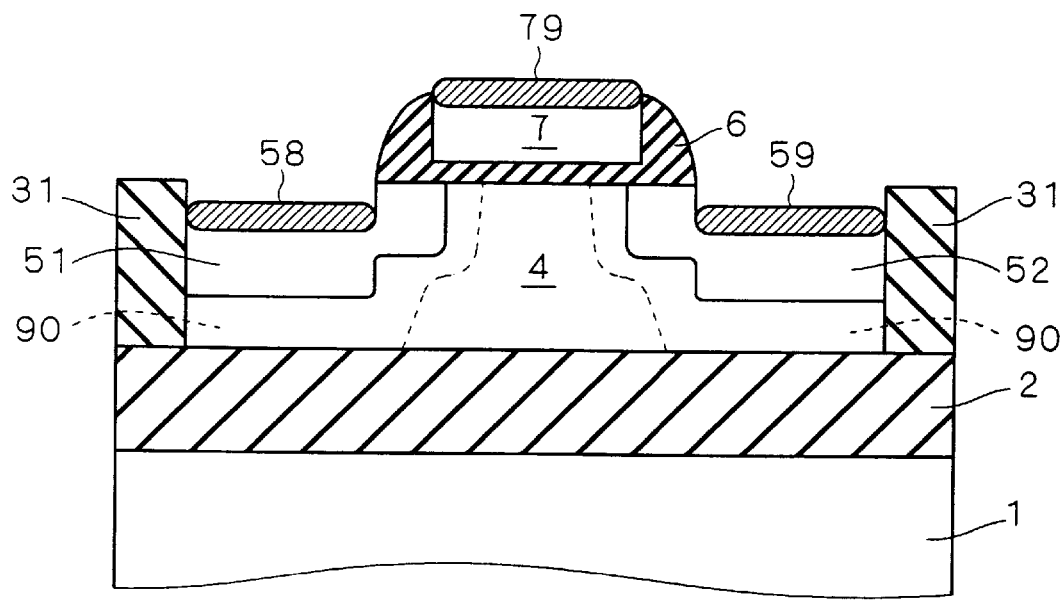
FIG. 8 is a cross-sectional view showing a variant of the third preferred embodiment of the present invention.

Reducing the thickness Xj of the source 51, on the other hand, makes it difficult to bring the ends of the depletion layer 90 in contact with the buried oxide film 2 according to the equations (1) to (3). To maintain the relations between the equations (1) to (3), the full thickness Ts of the SOI layer 4 where the source 51 is formed should preferably be reduced. FIG. 8 is a cross-sectional view showing a variant of the third preferred embodiment. In contrast to the structure of FIG. 6, the surface of the source 51 outside of the gate oxide film 6 caves in considerably. That is, the distances from the respective surfaces of the silicide layers 58, 59 to the buried oxide film 2 are smaller than the thickness of the SOI layer 4 between the gate oxide film 6 and the buried oxide film 2. In this structure, it is easy to bring the ends of the depletion layer 90 in contact with the buried oxide film 2 while reducing the thickness Xj of the source 51.

Figure 9:
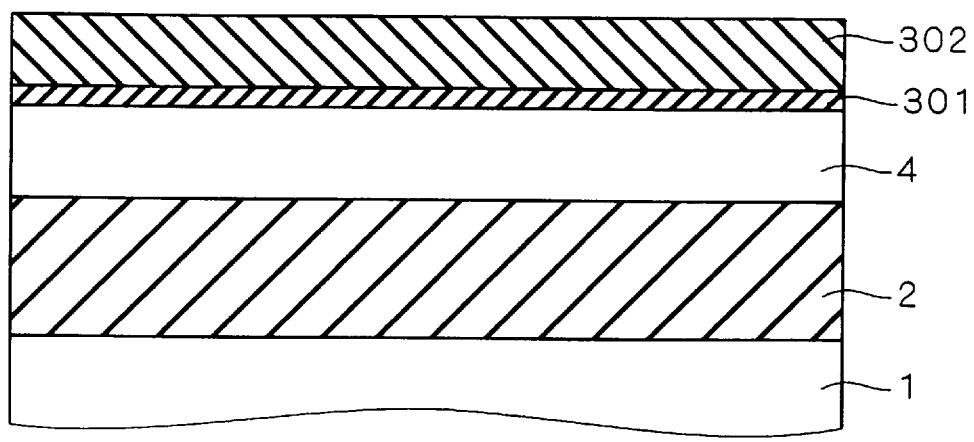
FIGS. 9 through 19 are cross-sectional views showing, in order of successive steps, a method of manufacturing a semiconductor device adopting the SOIMOS transistor of the third preferred embodiment of the present invention.

FIGS. 9 through, 19 are cross-sectional views showing, in order of successive steps, a method of manufacturing a semiconductor device using the SOIMOS transistor shown in FIG. 6. The semiconductor substrate 1 is formed of silicon, and the buried oxide film 2 and the SOI layer 4 are formed in this order on the substrate 1. Then, an oxide film 301 is formed to a thickness in the range of 100 to 300 Å by thermal oxidation at 850° C. and a silicon nitride film 302 is deposited to a thickness in the range of 1,000 to 3,000 Å by low pressure chemical vapor deposition (LPCVD) for example at 700–800° C. This results in the structure shown in FIG. 9.

Next a patterned mask is formed on the silicon nitride film 302 for example using resist, and the silicon oxide film 301 and the silicon nitride film 302 are dry etched by reactive ion etching (RIE). The silicon nitride film 302 patterned by this etching is used as a mask for dry etching of the SOI layer 4 using RIE, to thereby form trenches 303. This results in the structure shown in FIG. 10.

Figure 11:
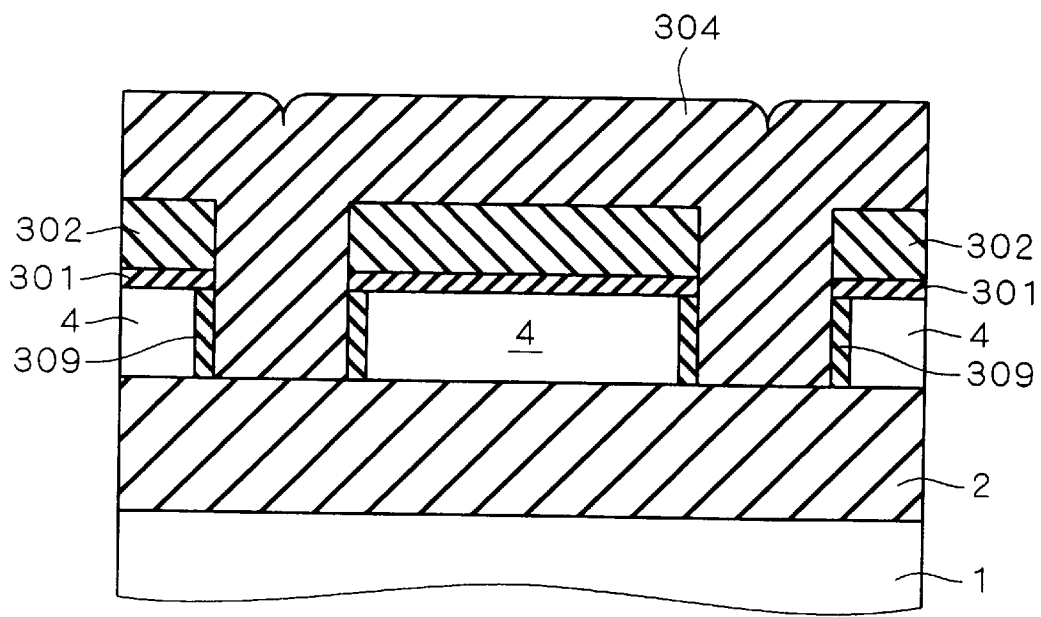

Further, the inner walls of the trenches 303 are subjected to thermal oxidation at 800–1000° C. to form in-wall oxide films 309 having a thickness from 100 to 1,000 Å. Then, a silicon oxide film 304 is deposited to a thickness in the range of 3,000 to 6,000 Å by CVD to fill the trenches 303. This results in the structure shown in FIG. 11.

Figure 12:
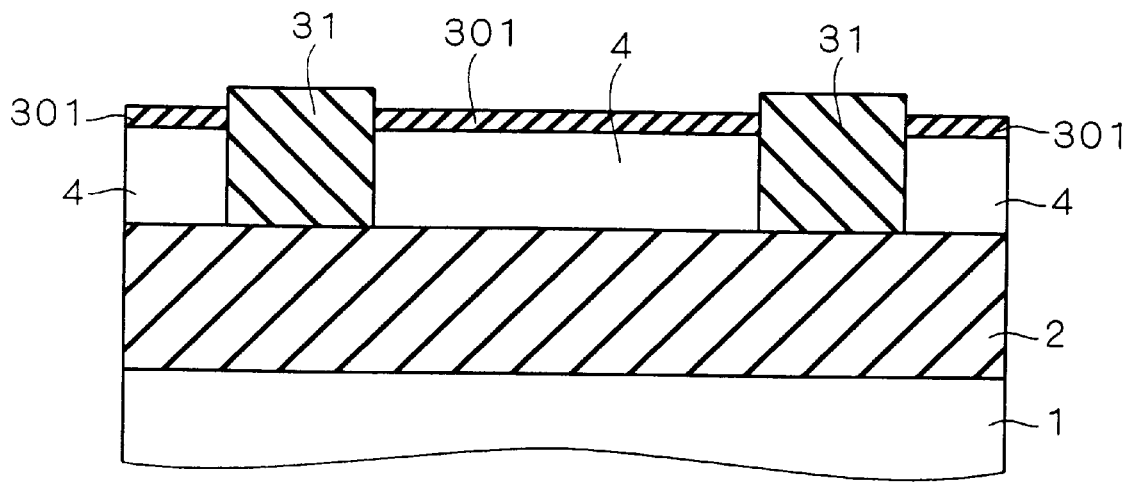

After the upper surface is planarized by chemical mechanical polishing using the silicon nitride film 302 as a stopper, the silicon nitride film 302 is removed by thermal phosphoric acid. By this removal, the silicon oxide film 301 on the SOI layer 4 in which no trench 303 is formed remains and a trench isolation oxide film 31 comprised of the in-wall oxide film 309 and the silicon oxide film 304 is formed in each trench 303. This results in the structure shown in FIG. 12.

Figure 13:
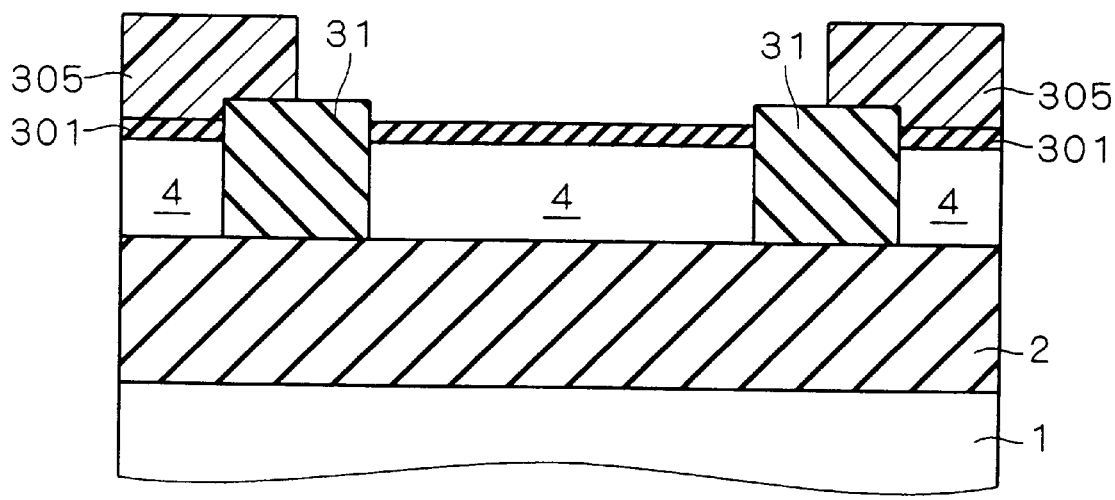
Figure 14:
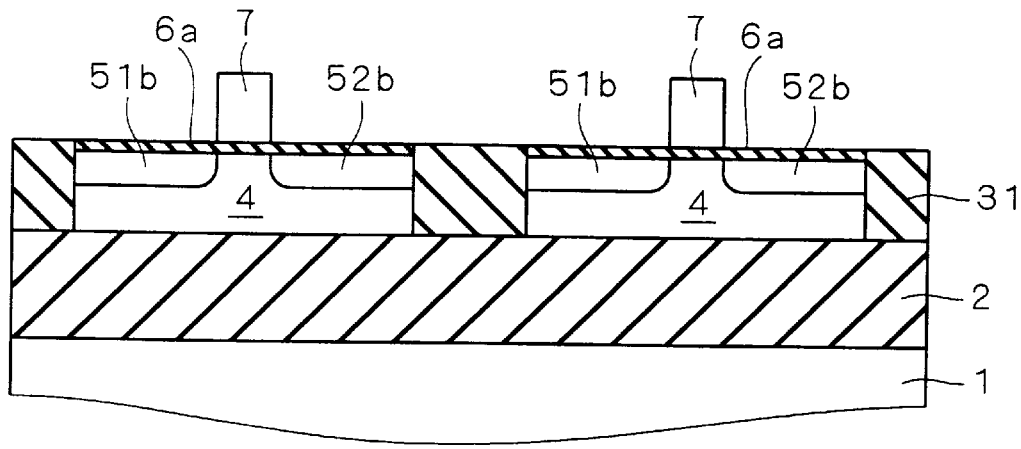

The next process is channel ion implantation using a patterned resist 305 as a mask (FIG. 13). In the active region where an n-type MOS transistor is formed, for example, boron ions are implanted at an energy in the range of 10 to 70 keV at a dose in the range of $5 \times 10^{11}$ to $3 \times 10^{13}$ $cm^{-2}$. In the active region where a p-type MOS transistor is formed, arsenic ions are implanted at an energy in the range of 10 to 120 keV at a dose in the range of $5 \times 10^{11}$ to $3 \times 10^{13}$ $cm^{-2}$. Thus, the threshold voltages of the respective n-type and p-type MOS transistors can be set to be in the range of 0.1 to 0.6 V and in the range of −0.1 to −0.6 V, respectively. FIGS. 14 through 19 show a pair of SOI transistors without distinction between p-type and n-type.

The silicon oxide film 301 on the active regions is then removed by wet etching and a gate oxide film 6a is formed to a thickness for example in the range of 20 to 300 Å, for example. On the gate oxide film 6a, polysilicon is deposited by LPCVD at 600–700° C. to a thickness in the range of 1,000 to 3,000 Å. Through shaping by RIE using a mask patterned by the lithographic techniques, the gate electrodes 7 are formed. Further, the regions 51b, 52b with low impurity concentration are formed by selective ion implantation in the surface of the SOI layer 4 through the gate oxide film 6a. This results in the structure shown in FIG. 14.

In the drawings, as above described, conductivity types of the SOIMOS transistors are not shown and thus the pair of transistors may be of different conductivity types. For example, in the active region where an n-type MOS transistor is formed, arsenic ions are implanted at a dose in the range of $5\times10^{13}$ to $5\times10^{15}$ cm$^{-2}$; and in the active region where a p-type MOS transistor is formed, boron fluoride (BF$_2$) ions are implanted at a dose in the range of $5\times10^{13}$ to $5\times10^{15}$ cm$^{-2}$.

Next a silicon oxide film formed of tetraethylorthosilicate (TEOS) is deposited to a thickness in the range of 1,000 to 2,000 Å and then etched back by RIE to form sidewalls 6b. Following this, the gate oxide film 6a is removed except portions immediately below the sidewalls 6b and the gate electrodes 7. This results in the structure shown in FIG. 15. In the description, we may refer to the remaining gate oxide film 6a and the sidewalls 6b together as the gate oxide film 6. Alternatively, the sidewalls 6b may be silicon nitride films.

Figure 16:
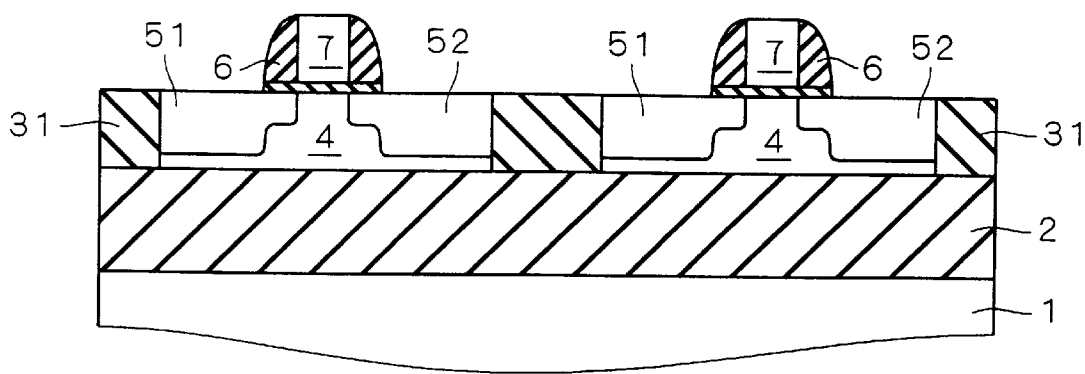
Figure 17:
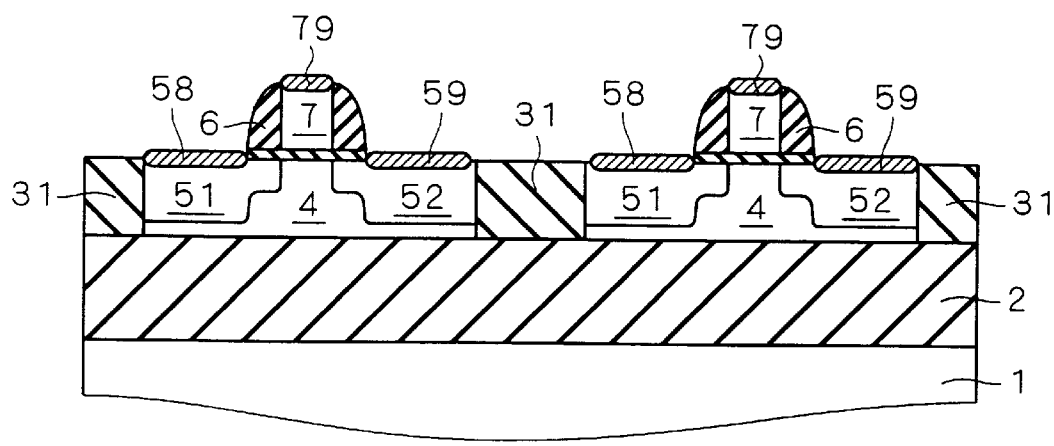
Figure 18:
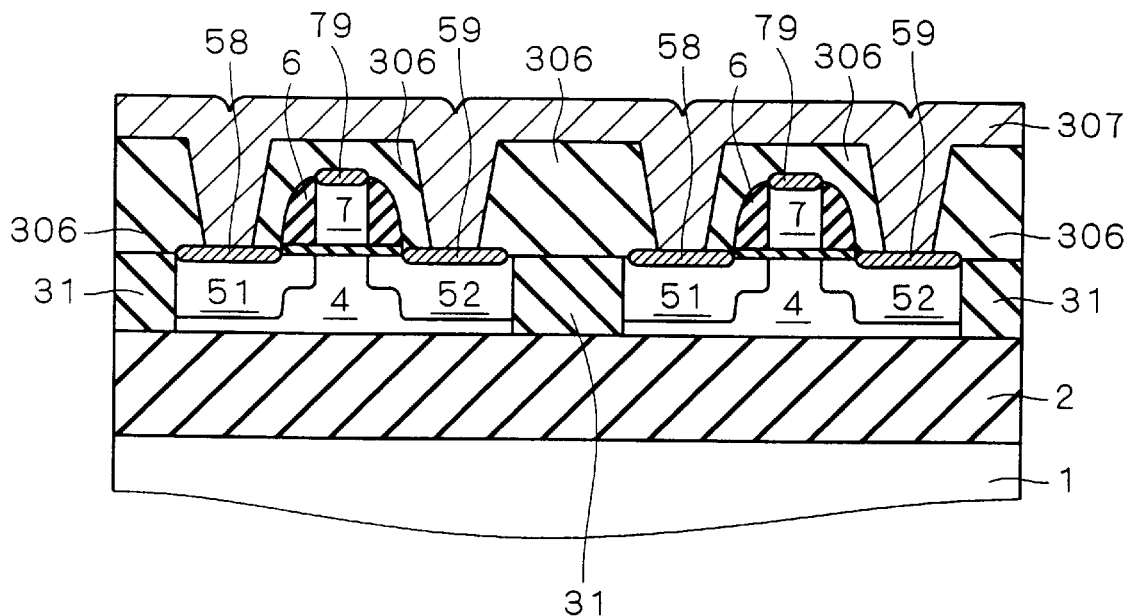
Figure 19:
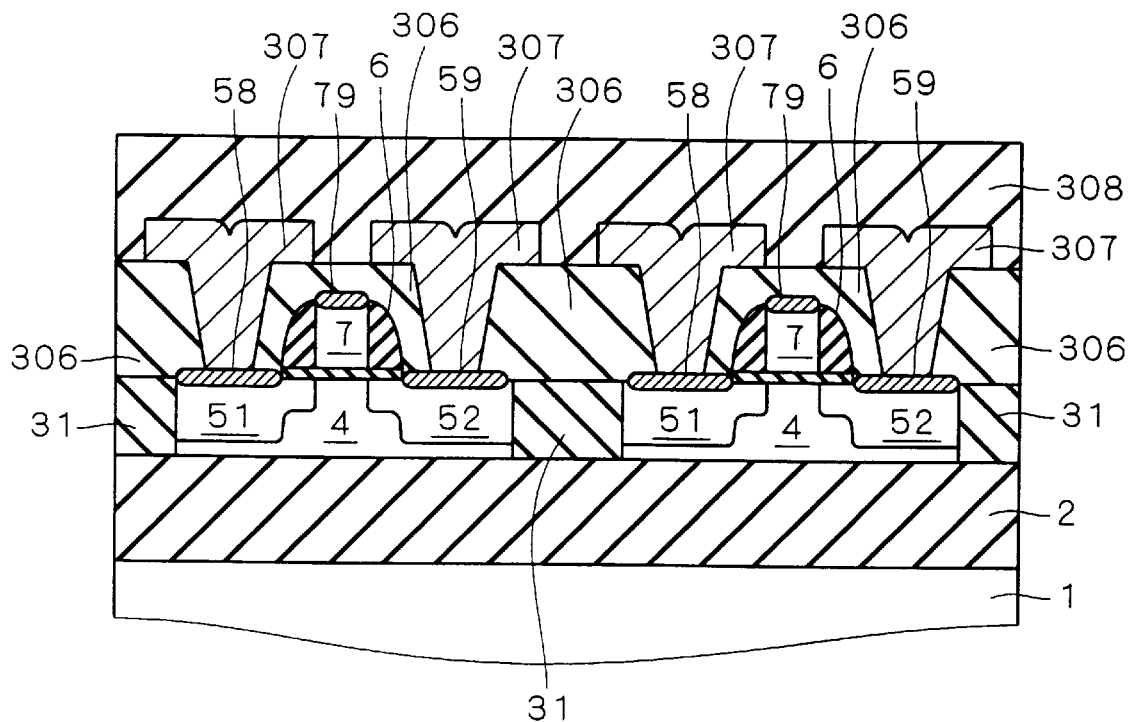

Then the regions 51a, 52a with high impurity concentration are formed by selective ion implantation in the surface of the SOI layer 4 to thereby obtain the structure shown in FIG. 16. For a 1,000-Å-thick SOI layer 4, for example, ions are implanted at an energy of 20 keV or less so that the regions 51a and 52a with high impurity concentration are kept from contact with the buried oxide film 2. In the active region where an n-type MOS transistor is formed, arsenic ions are implanted at a dose in the range of $1\times10^{15}$ to $1\times10^{16}$ cm$^{-2}$; and in the active region where a p-type MOS transistor is formed, boron fluoride (BF$_2$) ions are implanted at the same dose.

Then, cobalt (Co) or titanium (Ti) is deposited by a sputtering method to a thickness in the range of 50 to 150 Å and heat-treated at about 400° C. by rapid thermal annealing (RTA). The cobalt or titanium is subsequently removed by wet etching from all the surface except the surface of the source 51, the drain 52, and the gate electrode 7, and further heat treatment is carried out at 800–1000° C. by RTA. This step produces the silicide layers 58, 59, and 79 on the source 51, the drain 52, and the gate electrode 7, respectively, resulting in the structure shown in FIG. 17.

Further a silicon oxide film 306 is deposited to a thickness of about 1 μm and an opening is formed in a portion of the silicon oxide film 306 on the silicide layers 58, 59 by RIE using a mask patterned by the lithographic techniques. After that, an aluminum layer 307 is deposited to a thickness of about 1 μm by a sputtering method. This results in the structure shown in FIG. 18.

The aluminum layer 307 is then patterned by RIE using a mask patterned by the lithographic techniques and a silicon oxide film 308 is deposited to a thickness of about 1 μm. This results in the structure shown in FIG. 19.

Following this, an opening is formed in a predetermined portion of the silicon oxide film 308 to expose the aluminum layer 307 and hydrogen annealing is performed at 400° C. for 30 minutes.

Figure 15:
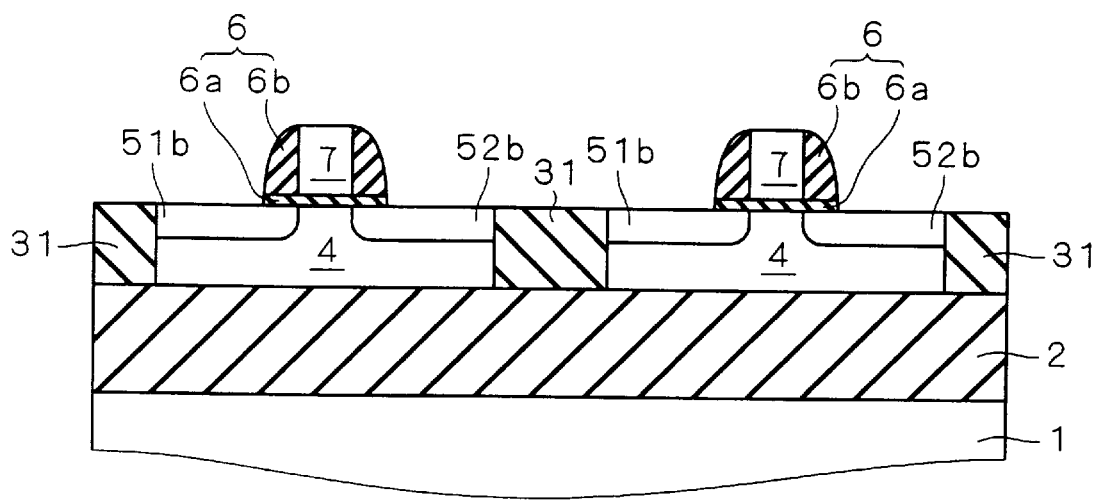

In order to adopt the structure of FIG. 8 to the above semiconductor device, etching for the formation of the sidewalls 6 in the process of FIG. 15 should be over-etching, so that the surfaces of the regions 51b and 52b are removed and the total thickness of the SOI layer 4 becomes thinner than the thickness thereof immediately below the gate electrode 7.

Fourth Preferred Embodiment

Figure 20:
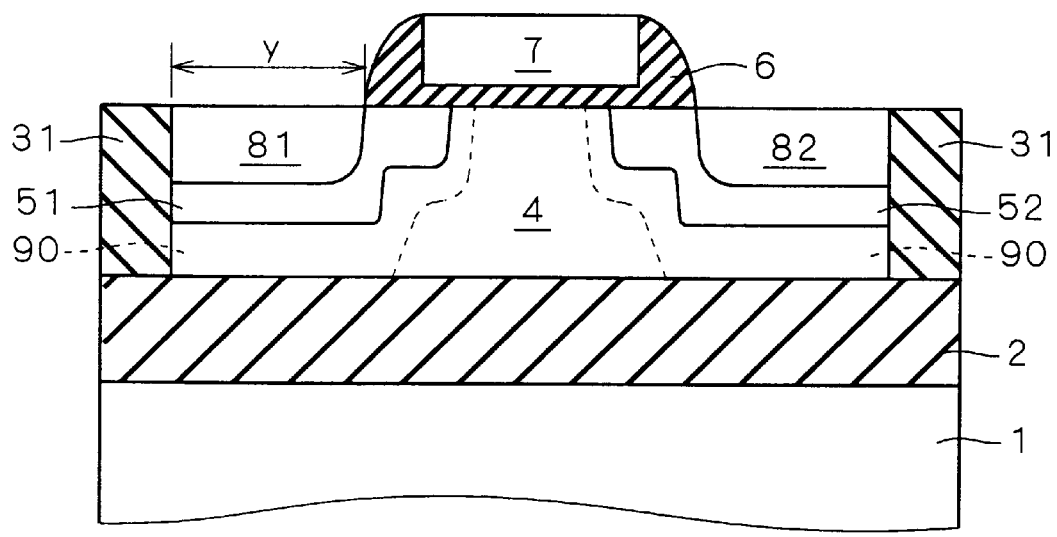
FIG. 20 is a cross-sectional view showing the structure of an SOIMOS transistor according to a fourth preferred embodiment of the present invention.

The present invention can adopt the second conventional technique. FIG. 20 is a cross-sectional view showing the structure of an SOIMOS transistor according to a fourth preferred embodiment. This structure is characteristically different from that of FIG. 1 in that the germanium-implanted regions 81 and 82 are formed in the upper surfaces of the source 51 and the drain 52, respectively. In the fourth preferred embodiment, the relations between the equations (1) to (3) should preferably be maintained but it is not an absolute necessity.

Figure 24:
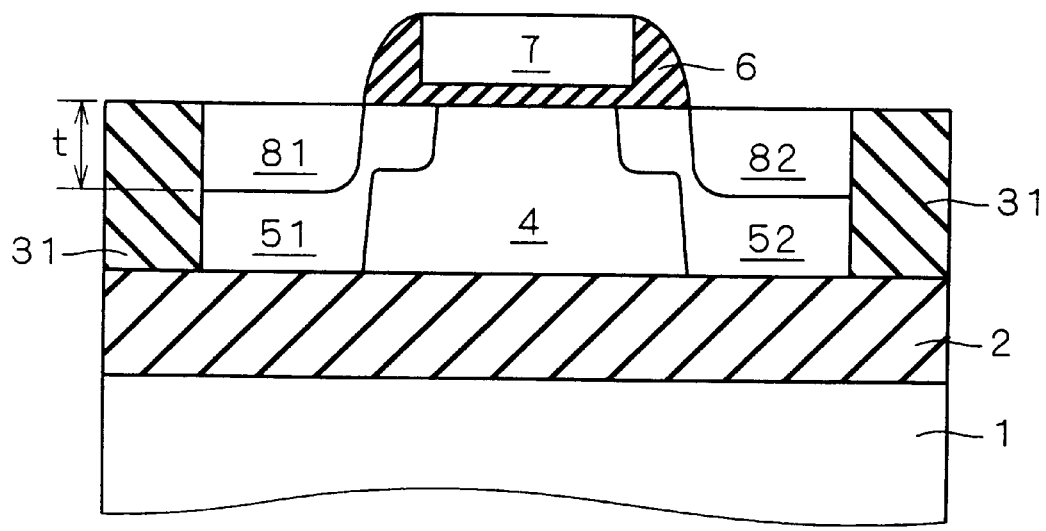
FIG. 24 is a cross-sectional view showing another structure of a conventional SOIMOS transistor.
Figure 25:
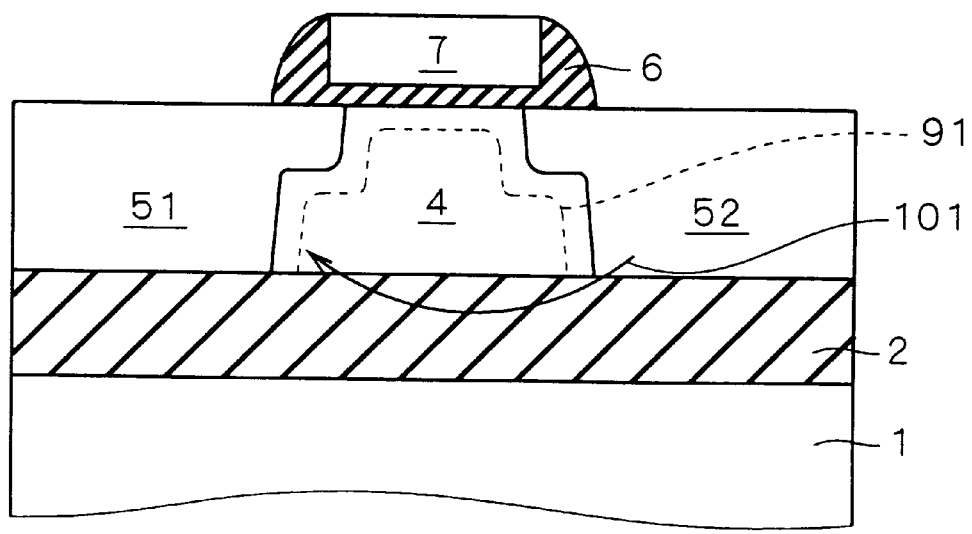
FIG. 25 is a cross-sectional view to explain a conventional technique.

The fourth preferred embodiment has not only the effect of reducing the parasitic capacitance in the structure shown in FIG. 24 but also the effect of extensively spreading distortion of the band structure between the region 81 and the source 51. In the structure of FIG. 24, the area of a portion where distortion of the band structure occurs is at most t·w where t is the thickness of the region 81; however, that area is increased by w·y in the structure of FIG. 20 where y is the length thereof exposed in a direction of the gate length. When w=1 μm, y=5 μm, t=50 nm, for example, the area of a portion which contributes to the prevention of accumulation of holes in the fourth preferred embodiment is about 101 times wider than that in the structure of FIG. 22. Since this effect is achieved by the distortion of the band structure, the relations between the equations (1) to (3) may not hold as long as the source 51 and the drain 52 are kept from contact with the buried oxide film 2.

With the relations between the equations (1) to (3) maintained, the effect of the second conventional technique can further be enhanced while suppressing the junction capacitance as in the first preferred embodiment.

Fifth Preferred Embodiment

Figure 21:
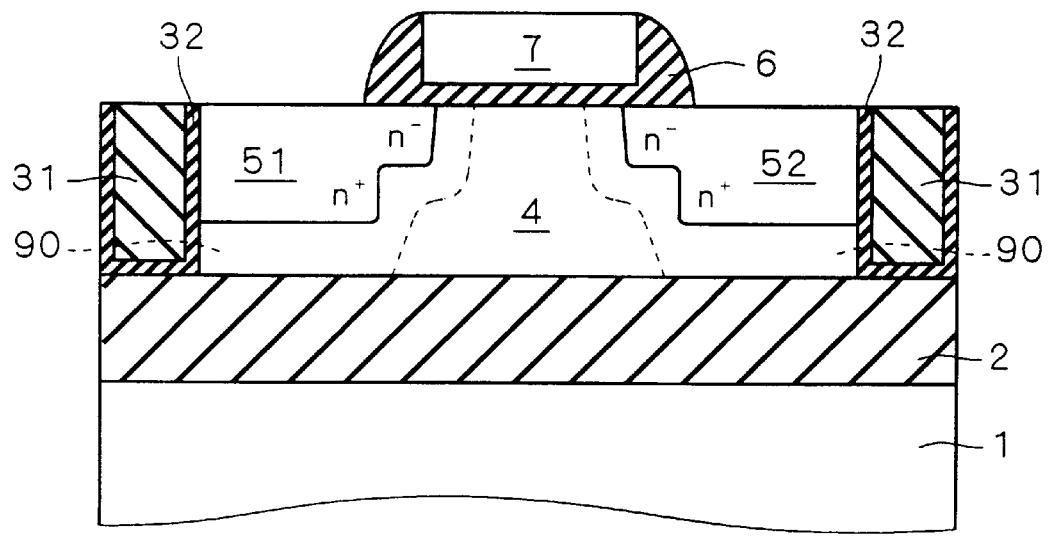
FIG. 21 is a cross-sectional view showing the structure of an SOIMOS transistor according to a fifth preferred embodiment of the present invention.

FIG. 21 is a cross-sectional view showing the structure of an SOIMOS transistor according to a fifth preferred embodiment. This structure is characteristically different from that of FIG. 1 in that the trench isolation oxide film 31 is surrounded by an insulation film 32 containing nitrogen. Such a trench isolation technique itself is disclosed for example in Japanese Patent Laid-open No. P06-302681A. The structure of the fifth preferred embodiments is adaptable to structures where the relations between the equations 1 to 3 are not maintained and structures in which the source 51 and the drain 52 are in contact with the buried oxide film 2. More specifically, in the SOIMOS transistor according to the fifth preferred embodiment, the source 51 and the drain 52 are provided apart from each other in the upper surface of the SOI layer 4 formed on the buried oxide film 2. There are also provided the nitrogen-containing insulation films 32, one of which is formed through the SOI layer 4 to be adjacent to the drain 52 on the opposite side of the source 51 and the other of which is formed through the SOI layer 4 to be adjacent to the source 51 on the opposite side of the drain 52.

Nitrogen in the insulation film 32 produces crystal defects, crystal distortion, point defects and recombination centers, all of which are to be lifetime killers, at interfaces and its vicinity between the insulation film 32 and each of the SOI layer 4, the source 51, and the drain 52. Therefore, the parasitic bipolar effect can be suppressed by adopting the trench isolation oxide film 31, which is surrounded by the insulation film 32 containing nitrogen, to an SOIMOS transitor. This is the same effect as obtained in the first preferred embodiment. Of course, the relations between the equations (1) to (3) should preferably be maintained for further suppression of the parasitic bipolar effect.

Figure 10:
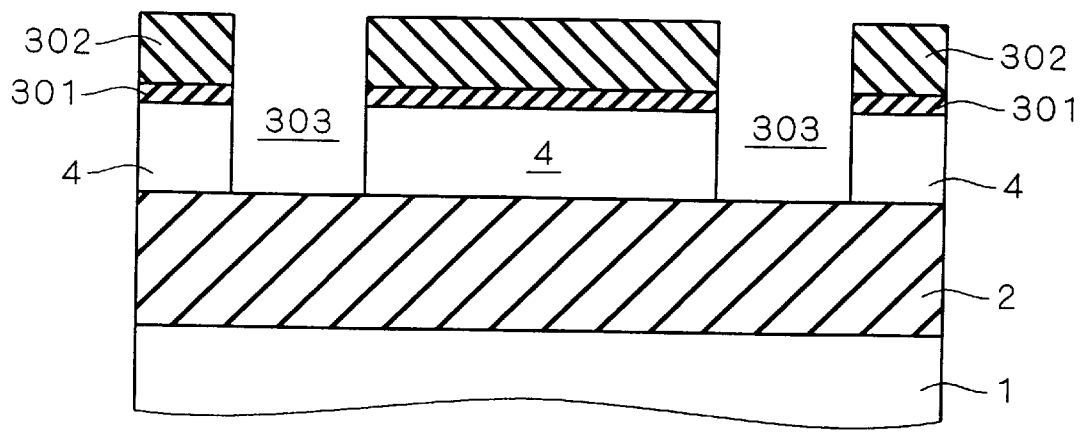

The insulation film 32 can be formed, after the formation of the structure shown in FIG. 10, by depositing a nitride film of a thickness from 10 to 1,000 Å in the inner walls of the trenches 303 for example by LPCVD at 700–850° C. Alternatively, a nitride film for the formation of the insulation film 32 may be obtained by rapid thermal processing (RTP) at 800–1000° C. At this time, before the deposition of the insulation film 32, an oxide film of a thickness from 10 to 800 Å may previously be formed on the inner walls by thermal oxidation. After the insulation film 32 is formed on the oxide film, the silicon oxide film 34 is deposited to a thickness in the range of 3,000 to 6,000 Å by CVD so as to fill the trenches 303. Then, the steps described with FIG. 11 and afterward are followed.

Here the insulation film 32 may be an $Si_3N_4$ film, an $Si_3N_4/SiO_2$ laminate film, an $SiO_2/Si_3N_4$ laminate film (ON film), or an $SiO_2/Si_3N_4/SiO_2$ laminate film (ONO film).

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

an insulating layer;

a semiconductor layer of a first conductivity type provided on said insulating layer;

first and second impurity regions of a second conductivity type opposite to said first conductivity type, which are provided apart from each other in an upper surface of said semiconductor layer so as to be kept from contact with said insulating layer, each of said first and second regions including a first impurity layer and a second impurity layer; and an electrode opposed to a portion of said upper surface of said semiconductor layer which is sandwiched between said first and second impurity regions, with an insulation film in between, wherein a depletion layer formed by said first impurity layer of each of said first and second regions and said semiconductor layer extends to said insulating layer without application of voltage from outside, wherein said first impurity layer is formed by introducing impurities of said second conductivity type into said semiconductor layer; and the following equation holds:

$$\sqrt{(2\epsilon s/q) \cdot ((Ne+Nb)/Ne \cdot Nb) \cdot (kT/q)\ln(Ne \cdot Nb/ni^2)} \geq t$$

where t is the thickness of said semiconductor layer between said insulating layer and said first impurity layer; Nb is the impurity concentration of said semiconductor layer; Ne is the impurity concentration of said first impurity layer; q is the elementary charge; k is Boltzman's constant; T is the absolute temperature; and ni, ∈s are the intrinsic carrier concentration and the dielectric constant of said semiconductor layer and said first impurity layer.

2. The semiconductor device according to claim 1, wherein said first impurity layer is made with silicon; and said second impurity layer is made with silicon and germanium.

3. A semiconductor device comprising:

an insulating layer;

a semiconductor layer of a first conductivity type provided on said insulating layer;

first and second impurity regions of a second conductivity type opposite to said first conductivity type, which are provided apart from each other in an upper surface of said semiconductor layer so as to be kept from contact with said insulating layer; and an electrode opposed to a portion of said upper surface of said semiconductor layer which is sandwiched between said first and second impurity layers, with an insulation layer in between; and a third impurity layer provided apart from said semiconductor layer in an upper surface of said first impurity layer, said third impurity layer causing distortion of a band structure of said first impurity layer which is sandwiched between said third impurity layer and said semiconductor layer, wherein said first impurity layer is made with silicon; and said second impurity layer is made with silicon and germanium, wherein said first impurity layer is formed by introducing impurities of said second conductivity type into said semiconductor layer; and the following equation holds:

$$\sqrt{(2\epsilon s/q) \cdot ((Ne+Nb)/Ne \cdot Nb) \cdot (kT/q)\ln(Ne \cdot Nb/ni^2)} \geq t$$

where t is the thickness of said semiconductor layer between said insulating layer and said first impurity layer; Nb is the impurity concentration of said semiconductor layer; Ne is the impurity concentration of said first impurity layer; q is the elementary charge; k is Boltzman's constant; T is the absolute temperature; and ni, ∈s are the intrinsic carrier concentration and the dielectric constant of said semiconductor layer and said first impurity layer.

4. The semiconductor device according to claim 3, wherein said first impurity layer is made with silicon; and said third impurity layer is made with silicon and germanium.

5. A semiconductor device according to claim 3, comprising:

an insulating layer;

a semiconductor layer of a first conductivity type provided on said insulating layer;

first and second impurity regions of a second conductivity type opposite to said first conductivity type, which are provided apart from each other in an upper surface of said semiconductor layer so as to be kept from contact with said insulating layer, each of said first and second regions includes a first impurity layer and second impurity layer; and an electrode opposed to a portion of said upper surface of said semiconductor layer which is sandwiched between said first and second impurity layers, with an insulation layer in between.

6. The semiconductor device according to claim 5, wherein said first impurity layer is made with silicon; and said second impurity layer is made with silicon and germanium.

* * * * *